United States Patent

Wang et al.

[11] Patent Number: 6,130,445
[45] Date of Patent: Oct. 10, 2000

[54] LED WITH ALGAINP BRAGG LAYER

[75] Inventors: Wang Nang Wang, Bath, United Kingdom; Stephen Sen-Tien Lee, Taipei, Taiwan

[73] Assignee: Arima Optoelectronics Corporation, Taipei, Taiwan

[21] Appl. No.: 09/451,356

[22] Filed: Dec. 2, 1999

[30] Foreign Application Priority Data

Dec. 2, 1998 [GB] United Kingdom ............... 9826510

[51] Int. Cl.[7] .................. H01L 33/00; H01S 3/19
[52] U.S. Cl. .............. 257/98; 257/103; 372/96; 372/99
[58] Field of Search ................. 257/94, 96, 98, 257/103; 372/45, 46, 96, 99

[56] References Cited

U.S. PATENT DOCUMENTS

| 5,428,634 | 6/1995 | Bryan et al. | 372/96 |
| 5,675,605 | 10/1997 | Fujii | 257/13 |

Primary Examiner—Minh Loan Tran
Attorney, Agent, or Firm—Christie, Parker & Hale, LLP

[57] ABSTRACT

A semiconductor light emitting device includes two AlGaAs and AlGaInP Bragg reflector layers below an active layer.

4 Claims, 1 Drawing Sheet

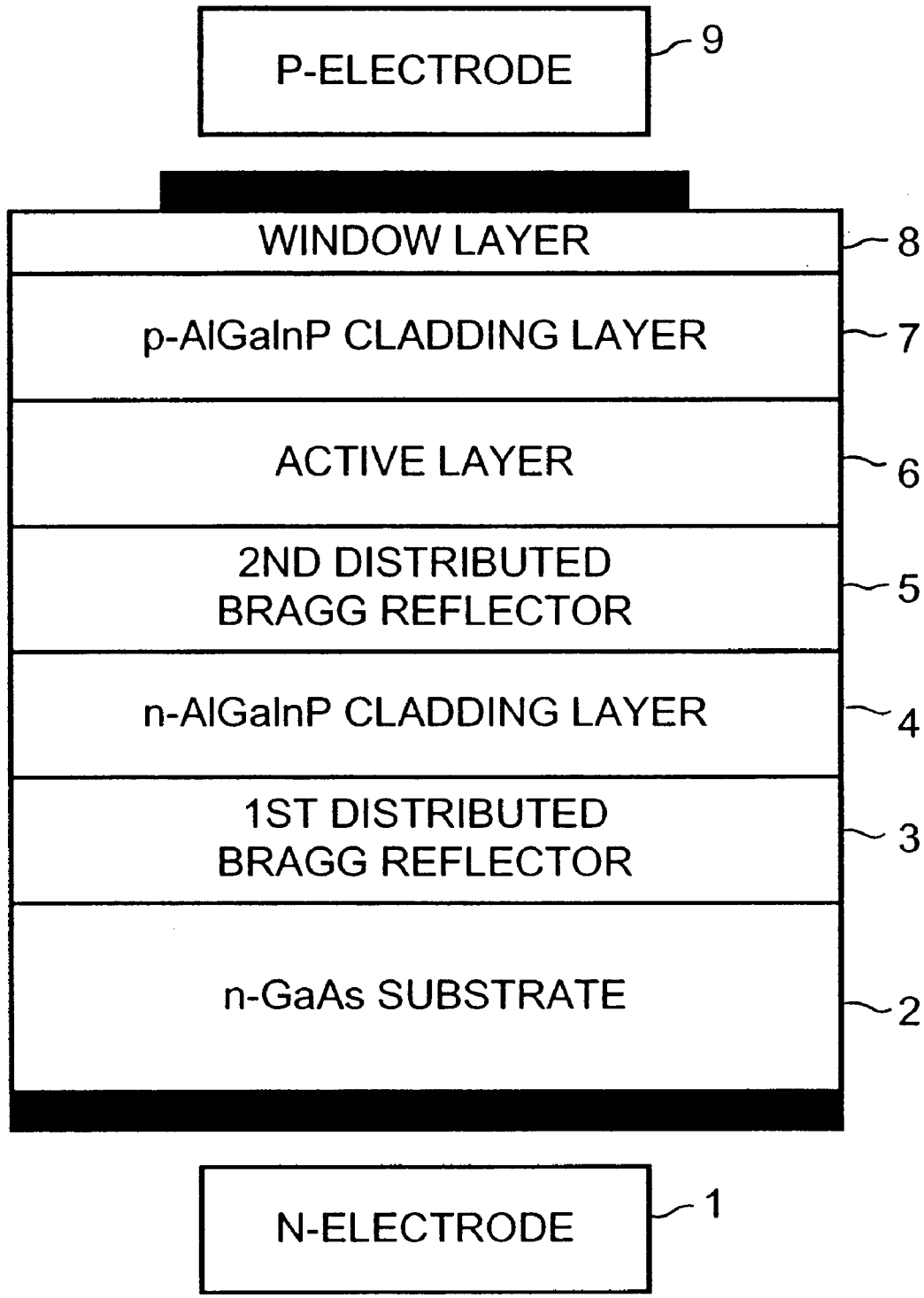

LED WITH ALGAINP BRAGG LAYER

FIELD OF THE INVENTION

The present invention relates to light-emitting diodes (LEDs).

SUMMARY OF THE INVENTION

According to the present invention, there is provided an LED including an ALGaINP Bragg reflector layer.

BRIEF DESCRIPTION OF THE DRAWING

The present invention will now be described, by way of example, with reference to the accompanying drawing, which is a section through an example of an LED according to the invention.

DESCRIPTION OF THE EMBODIMENT

Referring to the drawing, alight-emitting diode comprises: an ohmic n-electrode 1 on a rear surface of a GaAs substrate 2; a first, lower distributed AlGaAs Bragg reflector layer 3 grown on the substrate 2; a first, lower n-AlGaInP cladding layer 4 grown on the layer 3; a second, upper distributed AlGaInP Bragg reflector layer 5 grown on the layer 4; an active layer 6 grown on the layer 5; a second, upper p-AlGaInP cladding layer 7 grown on the layer 6; AlGaInP window layer 8 grown on the layer 7; and an ohmic p-electrode on the layer 8.

The active layer 6 could be replaced by a double hetero-junction layer or multi-quantum well layer.

Each Bragg reflector layer is in the form of a multi-layer lamination.

Compositions of a typical example are set out below.

1. Lower distributed Bragg reflector layer 3

$Al_xGa_{1-x}As/Al_yGa_{1-y}As$ where $0 \pm x \pm 1$; $0 \pm y \pm 1$; $x \neq y$ 2. Cladding layers 4 and 7

$(Al_xGa_{1-x})_{1-y}In_yP$ where $0.5 \pm x \pm 1$; $0.4 \pm y \pm 0.6$

Thickness $0.5 \mu m \pm D \pm 1.5 \mu m$

3. Upper distributed Bragg reflector layer 5 $(Al_{x1}Ga_{1-x1})_{1-y1}In_{y1}P/(Al_{x2}Ga_{1-x2})_{1-y2}In_{y2}P$ where $0 \pm x1 \pm 1$; $0.4 \pm y1 \pm 0.6$ $0 \pm x2 \pm 1$; $0.4 \pm y2 \pm 0.6$ 4. Window layer 8

$Ga_xIn_{1-x}P$ where $0.9 \pm x \pm 1$

Thickness $5 \mu m \pm D \pm 15 \mu m$

What is claimed is:

1. A light emitting diode with two AlGaAs and AlGaInp Bragg reflector layers comprising:

an ohmic n-electrode on a rear surface of a GaAs substrate;

a first, lower distributed AlGaAs Bragg reflector layer grown on the substrate;

a first, lower n-AlGaInP cladding layer grown on the first Bragg reflector layer;

a second, upper distributed AlGaInP Bragg reflector layer grown on the first cladding layer;

an active layer grown on the second Bragg reflector layer;

a second, upper p-AlGaInP cladding layer grown on the active layer;

a GaInP window layer grown on the upper cladding layer; and an ohmic p-electrode on the window layer.

2. A device according to claim 1, wherein each Bragg reflector layer is in the form of a multi-layer lamination.

3. A device according to claim 1, wherein the upper Bragg reflector layer has the composition:

$(Al_{x1}Ga_{1-x1})_{1-y1}In_{y1}P/(Al_{x2}Ga_{1-x2})_{1-y2}In_{y2}P$ where $0 \pm x1 \pm 1$; $0.4 \pm y1 \pm 0.6$ $0 \pm x_2 \pm 1$; $0.4 \pm y_2 \pm 0.6$.

4. A device according to claim 1, wherein the active layer is a double hetero-junction layer or a multi-quantum well layer.

* * * * *

UNITED STATES PATENT AND TRADEMARK OFFICE
CERTIFICATE OF CORRECTION

PATENT NO. : 6,130,445
DATED : October 10, 2000
INVENTOR(S) : Wang Nang Wang; Stephen Sen-Tien Lee It is certified that error appears in the above-identified patent and that said Letters Patent is hereby corrected as shown below:

<u>Column 2,</u>
Line 14, replace "AlGaInp" with -- AlGaInP --.
Lines 37 and 38, replace
"where $0 \pm x\ 1 \pm 1;\ 0.4 \pm y\ 1 \pm 0.6$
$0 \pm x_2 \pm 1;\ 0.4 \pm y_2 \pm 0.6$" with
-- where $0 \leq x\ 1 \leq 1;\ 0.4 \leq y\ 1 \leq 0.6$
$0 \leq x_2 \leq 1;\ 0.4 \leq y_2 \leq 0.6$. --

Signed and Sealed this

Fifth Day of March, 2002

Attest:

*Attesting Officer*

JAMES E. ROGAN
*Director of the United States Patent and Trademark Office*